United States Patent
Lee et al.

(10) Patent No.: US 9,202,799 B2
(45) Date of Patent: Dec. 1, 2015

(54) TEMPORARY BONDING SCHEME

(71) Applicant: Taiwan Semiconductor Manufacturing Company, Ltd., Hsin-Chu (TW)

(72) Inventors: Wan-Yu Lee, Taipei (TW); Ying-Hao Kuo, Hsin-Chu (TW); Kuo-Chung Yee, Taoyuan (TW)

(73) Assignee: Taiwan Semiconductor Manufactruing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/097,054

(22) Filed: Dec. 4, 2013

(65) Prior Publication Data

US 2015/0155260 A1    Jun. 4, 2015

(51) Int. Cl.
| | |
|---|---|
| *H01L 21/30* | (2006.01) |
| *H01L 23/00* | (2006.01) |
| *H01L 21/02* | (2006.01) |
| *H01L 23/31* | (2006.01) |
| *H01L 21/56* | (2006.01) |

(52) U.S. Cl.
CPC .......... *H01L 24/83* (2013.01); *H01L 21/02076* (2013.01); *H01L 21/568* (2013.01); *H01L 24/98* (2013.01); *H01L 21/561* (2013.01); *H01L 23/3107* (2013.01); *H01L 2223/54426* (2013.01); *H01L 2224/832* (2013.01); *H01L 2224/8349* (2013.01); *H01L 2224/83193* (2013.01); *H01L 2224/83896* (2013.01); *H01L 2924/065* (2013.01); *H01L 2924/068* (2013.01); *H01L 2924/10253* (2013.01); *H01L 2924/14* (2013.01); *H01L 2924/20103* (2013.01); *H01L 2924/20104* (2013.01); *H01L 2924/20105* (2013.01); *H01L 2924/20106* (2013.01)

(58) Field of Classification Search
USPC .................. 438/458, 118, 455, 456, 457, 464
See application file for complete search history.

(56) References Cited

U.S. PATENT DOCUMENTS

| | | | |
|---|---|---|---|
| 2012/0141786 A1* | 6/2012 | Uh et al. ........................ | 428/343 |
| 2014/0357020 A1* | 12/2014 | Aleksov et al. ............... | 438/107 |

* cited by examiner

*Primary Examiner* — Timor Karimy
(74) *Attorney, Agent, or Firm* — Slater & Matsil, L.L.P.

(57) ABSTRACT

A method includes filling a trench formed in a first integrated circuit carrier with temporary bonding material to form a temporary bonding layer. At least one chip is bonded over the temporary bonding layer.

20 Claims, 2 Drawing Sheets

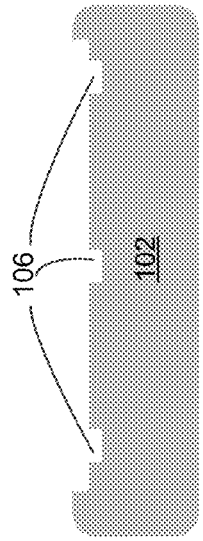
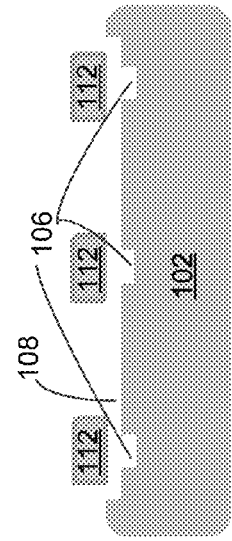
Fig. 2
Fig. 4
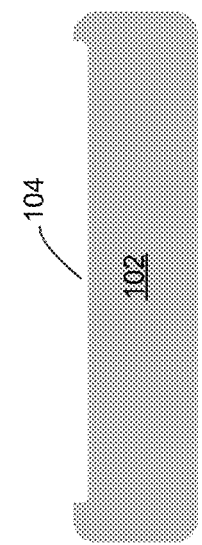
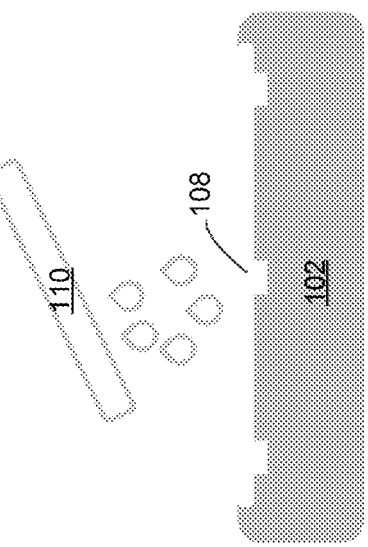
Fig. 1
Fig. 3

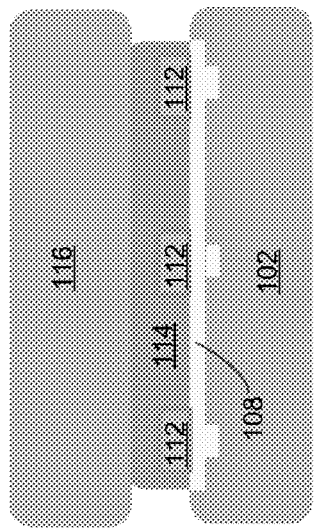
*Fig. 5*
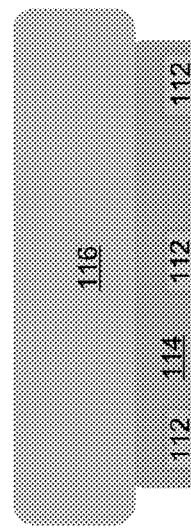
*Fig. 6*
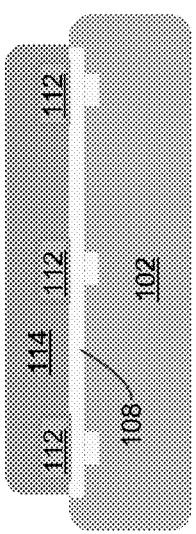
*Fig. 7*
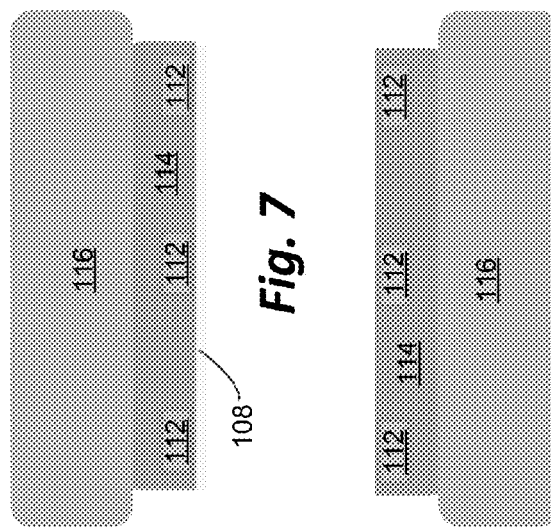
*Fig. 8*
*Fig. 9*

TEMPORARY BONDING SCHEME

TECHNICAL FIELD

The present disclosure relates generally to an integrated circuit and more particularly temporary bonding scheme.

BACKGROUND

In some integrated circuit fabrication processes, integrated circuit chips are temporarily bonded to a carrier for the subsequent processes. Some conventional methods for temporary bonding involve release films with relatively low adhesion strength. Such release films cannot be reused after one time use.

BRIEF DESCRIPTION OF THE DRAWINGS

Reference is now made to the following descriptions taken in conjunction with the accompanying drawings, in which:

FIG. 1 is a schematic diagram of a trench forming step of an exemplary temporary bonding scheme according to some embodiments;

FIG. 2 is a schematic diagram of an alignment mark forming step of the exemplary temporary bonding scheme according to some embodiments;

FIG. 3 is a schematic diagram of a trench filling step of the exemplary temporary bonding scheme according to some embodiments;

FIG. 4 is a schematic diagram of a chip bonding step of the exemplary temporary bonding scheme according to some embodiments;

FIG. 5 is a schematic diagram of a molding step of the exemplary temporary bonding scheme according to some embodiments;

FIG. 6 is a schematic diagram of a carrier mounting step of the exemplary temporary bonding scheme according to some embodiments;

FIG. 7 is a schematic diagram of a carrier de-bonding step of the exemplary temporary bonding scheme according to some embodiments;

FIG. 8 is a schematic diagram of a cleaning step of the exemplary temporary bonding scheme according to some embodiments; and FIG. 9 is a schematic diagram of a final step of the exemplary temporary bonding scheme according to some embodiments.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of a trench forming step of an exemplary temporary bonding scheme according to some embodiments. In FIG. 1, an integrated circuit carrier 102 ("carrier") is etched to form a trench 104. The carrier 102 comprises silicon, metal, glass, or any other suitable material. The trench 104 can be formed by wet or dry etching process, or any other suitable process. The trench 104 has a depth ranging from 1 µm to 25 µm in some embodiments. The size of the carrier 102 depends on various applications.

FIG. 2 is a schematic diagram of an alignment mark forming step of the exemplary temporary bonding scheme according to some embodiments. Open trenches are etched in the trench 104 in FIG. 1 to form the alignment marks 106 in FIG. 2. The alignment marks 106 are used to align integrated circuit chips 112 in FIG. 4 to be mounted over the carrier 102. The alignment marks 106 have widths ranging from 5 µm to 25 µm and depths ranging from 0.1 µm to 1 µm in some embodiments.

FIG. 3 is a schematic diagram of a trench filling step of the exemplary temporary bonding scheme according to some embodiments. Temporary bonding material 110 is melted by heating to the melting temperature to fill in the trench 104 and form the temporary bonding layer 108. The temporary bonding material 110 comprises thermoplastic material or any other suitable material. In some embodiments, the thermoplastic material comprises polystyrene, polyvinyl chloride (PVC), polycarbonates (PC), acrylonitrile butadiene styrene (ABS), or any combination thereof. The thermoplastic material has a relatively higher bonding strength below glass transition temperature of the thermoplastic material, compared with other conventional methods.

The melting temperature depends on the specific temporary bonding material 110 used in each application. In some embodiments, the melting temperature ranges from 100° C. to 250° C. In some other embodiments, the temperature can be higher, e.g., over 250° C. or even over 300° C. For example, polystyrene can be melted at 116° C., and ABS can be melted at about 100° C. in some embodiments. After the filling in the trench 104 with the temporary bonding material 110, the temporary bonding layer 108 is cooled off, e.g., from 30 minutes to 120 minutes at room temperature in some embodiments.

FIG. 4 is a schematic diagram of a chip bonding step of the exemplary temporary bonding scheme according to some embodiments. Integrated circuit chips 112 ("chips") are mounted on the temporary bonding layer 108 with ultrasonic or thermal method at a temperature ranging from 80° C. to 150° C., using alignment marks 106 for alignment in some embodiments.

FIG. 5 is a schematic diagram of a molding step of the exemplary temporary bonding scheme according to some embodiments. A molding layer 114 is formed over the chips 112 and the temporary bonding layer 108 by thermal compress or lamination in some embodiments. The molding layer 114 comprises molding compound such as liquid molding compound or sheet molding compound. The thickness of the molding layer 114 can be from 150 µm to 500 µm in some embodiments, and varies depending on various applications and the size of chips 112. In some embodiments, the molding temperature ranges from 80 C to 150° C. and the molding time ranges from 1 minute to 10 minutes.

FIG. 6 is a schematic diagram of a carrier mounting step of the exemplary temporary bonding scheme according to some embodiments. While the molding layer 114 is cured, another carrier 116 is mounted over the molding layer 114 at temperatures ranging from 80° C. to 150° C. The carrier 116 is attached to the molding layer 114 by van der Waals' bonding and hydrogen bonding in some embodiments. Even though no additional bonding layer between the carrier 116 and the molding layer 114 is needed, an adhesive layer may be used in between in some embodiments. The carrier 116 comprises silicon, metal, glass, or any other suitable material. The post mold cure process temperature ranges from 80° C. to 200° C. and the curing time ranges from 1 hour to 5 hours in some embodiments.

FIG. 7 is a schematic diagram of a carrier de-bonding step of the exemplary temporary bonding scheme according to some embodiments. The carrier 102 is de-bonded from the chips 112 and the molding layer 114 by heating the temporary bonding layer 108 to the melting temperature (i.e., thermal de-bonding). The melting temperature varies depending on the temporary bonding material of the temporary bonding layer 108. The temporary bonding material of the temporary bonding layer 108 can be reused after de-bonding to save costs. Also, the carrier 102 can be reused. Another method of de-bonding is to dissolve the temporary bonding material by solvents such as ketone type or Tetrahydrofuran (THF), but the dissolved material cannot be recycled.

FIG. 8 is a schematic diagram of a cleaning step of the exemplary temporary bonding scheme according to some embodiments. In some embodiments, the remaining temporary bonding layer 108 is cleaned by wet cleaning using solvents such as acetone, for example.

However, there are residues of the temporary bonding material from the temporary bonding layer 108 on the surface and inside of the molding layer 114 in some embodiments. The residue of the temporary bonding material such as thermoplastic can be detected by qualitative and quantitative analysis such as high performance liquid chromatography (HPLC) or mass spectrometer (MS) analysis.

The interfacing surface of the molding layer 114 with the temporary bonding layer 108 (e.g., comprising thermoplastic material) has the highest percentage of the residue of the temporary bonding material. Inside the molding layer 114, 1 ppm-100 ppm of the temporary bonding material can be also detected in some embodiments.

FIG. 9 is a schematic diagram of a final step of the exemplary temporary bonding scheme according to some embodiments. The assembly of the chips 112, the molding layer 114, and the carrier 116 can be repositioned so that the chips 112 are facing up for the subsequent fabrication steps.

According to some embodiments, a method includes filling a trench formed in a first integrated circuit carrier with temporary bonding material to form a temporary bonding layer. At least one chip is bonded over the temporary bonding layer.

According to some embodiments, an integrated circuit includes a molding layer and at least one chip disposed in the molding layer. The molding layer includes a thermoplastic material on a surface or inside.

A skilled person in the art will appreciate that there can be many embodiment variations of this disclosure. Although the embodiments and their features have been described in detail, it should be understood that various changes, substitutions, and alterations can be made herein without departing from the spirit and scope of the embodiments. Moreover, the scope of the present application is not intended to be limited to the particular embodiments of the process, machine, manufacture, and composition of matter, means, methods, and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method, comprising:
   melting a solid temporary bonding material to form a liquid temporary bonding material;
   filling a trench formed in a first integrated circuit carrier with the liquid temporary bonding material to form a temporary bonding layer; and
   allowing the temporary bonding layer to cool before bonding at least one chip over the temporary bonding layer.

2. The method of claim 1, further comprising forming at least one alignment mark in the trench.

3. The method of claim 1, further comprising forming a molding layer over the at least on chip.

4. The method of claim 3, further comprising mounting a second integrated circuit carrier over the molding layer.

5. The method of claim 1, further comprising de-bonding the first integrated circuit carrier.

6. The method of claim 5, wherein the first integrated circuit carrier is de-bonded by melting the temporary bonding layer.

7. The method of claim 5, further comprising cleaning the temporary bonding layer from the at least one chip.

8. The method of claim 7, wherein the temporary bonding layer is cleaned by a wet cleaning process.

9. The method of claim 1, wherein the temporary bonding material comprises thermoplastic material.

10. The method of claim 9, wherein the thermoplastic material comprises polystyrene, polyvinyl chloride (PVC), polycarbonates (PC), acrylonitrile butadiene styrene (ABS), or any combination thereof.

11. The method of claim 1, wherein the temporary bonding material is melted at a temperature ranging from 150° C. to 250° C. for filling the trench.

12. The method of claim 1, wherein the at least one chip is bonded over the temporary bonding layer at a temperature ranging from 80° C. to 150° C.

13. A method, comprising:
   forming a trench in a first integrated circuit carrier;
   melting a temporary bonding material;
   filling the trench with the temporary bonding material to form a temporary bonding layer;
   bonding at least one chip over the temporary bonding layer;
   forming a molding layer over the at least on chip;
   mounting a second integrated circuit carrier over the molding layer; and
   melting the temporary bonding layer to release the at least one chip from the temporary bonding layer.

14. The method of claim 13, further comprising forming at least one alignment mark in the trench.

15. The method of claim 13, further comprising de-bonding the first integrated circuit carrier.

16. The method of claim 13, wherein the temporary bonding material comprises thermoplastic material.

17. A method, comprising:
   forming a trench in a substrate;
   forming an alignment mark in the trench;
   filling the trench and alignment mark with a temporary bonding material;
   bonding at least one chip in the temporary bonding material;
   encapsulating the at least one chip in a molding compound; and
   melting the temporary bonding material to release the at least one chip from the substrate.

18. The method of claim 17, further comprising attaching a top surface of the molding compound to a second carrier before melting the temporary bonding material.

19. The method of claim 17, wherein the step of forming an alignment mark in the trench includes etching a second trench on a floor of the trench.

20. The method of claim 17, wherein the step of filling the trench and alignment mark with a temporary bonding material includes melting a thermoplastic material.

* * * * *